United States Patent
Mochizuki (12)

(10) Patent No.: US 6,300,159 B1
(45) Date of Patent: Oct. 9, 2001

(54) METHOD FOR PRODUCING SEMICONDUCTOR DEVICE AND PHOTODETECTOR DEVICE

(75) Inventor: Chiori Mochizuki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/526,185

(22) Filed: Mar. 15, 2000

Related U.S. Application Data

(62) Division of application No. 09/162,726, filed on Sep. 30, 1998, now Pat. No. 6,127,714.

(30) Foreign Application Priority Data

Oct. 1, 1997 (JP) .................................................. 9-268628

(51) Int. Cl.$^7$ ................................................. H01L 21/00
(52) U.S. Cl. ................................................................. 438/67
(58) Field of Search ................................... 438/64, 65, 66, 438/67, 68, 69, 73, 107, 110, 462, 973, 978, 982; 156/80

(56) References Cited

U.S. PATENT DOCUMENTS 5,272,113 * 12/1993 Quinn ...................................... 156/80

* cited by examiner

*Primary Examiner*—Keith Christianson
(74) *Attorney, Agent, or Firm*—Fitzpatrick, Cella, Harper & Scinto

(57) ABSTRACT

A large-area semiconductor device formed by adhering substrates, which is free from damages on the elements provided on each substrate during transportation thereof, also free from loss in the production yield and the uniformity of performance, thereby achieving a low cost and a high quality, can be realized by carrying out full-cutting in a substantially vertical direction of each substrate at an end surface on a side of the substrates to be mutually opposed to one another to detach an unnecessary portion, carrying out half-cutting on at least one end surface on a side other than the side to be opposed to merely form a groove between an unnecessary portion and the substrate to leave the unnecessary portion in a connected state, and arranging thus cut substrates so that the full-cutting end surfaces thereof are mutually opposed.

36 Claims, 8 Drawing Sheets

METHOD FOR PRODUCING SEMICONDUCTOR DEVICE AND PHOTODETECTOR DEVICE

This application is a division of Ser. No. 09/162,726 filed Sep. 30, 1998 now U.S. Pat. No. 6,127,714.

BACKGROUND OF THE INVENTION

1. Field of the Invention

The present invention relates to a method of producing a semiconductor device or a photodetector device by adhering a plurality of semiconductor substrates in a planar manner, and more particularly to a method of producing a semiconductor device having a plurality of semiconductor elements over a large area, a one- or two-dimensional image reading device adapted for use in a facsimile, a digital copying apparatus or a scanner, and a photodetector device for converting a radiation such as X-ray or gamma-ray into visible light or the like by a fluorescent plate and reading thus converted light.

2. Related Background Art

The amorphous silicon (hereinafter abbreviated as "a-Si") has been conventionally utilized as the semiconductor material for a large-area semiconductor device or as the photoelectric converting semiconductor material for a photodetecting device such as a sensor array. In particular, such film can be easily formed on a large-area glass plate and further it can be used not only as the photoelectric converting material but also as the semiconductor material for the switching TFT (thin film transistor). It is also widely employed as the semiconductor material for the sensor array, since the semiconductor layer of the photoelectric converting elements and the semiconductor layer of the switching TFT can be simultaneously formed.

As a typical example of the sensor array employing such a-Si film, there will be explained the constitution of a sensor array in which a PIN type photoelectric converting element is combined with an inverse staggered TFT constituting a switching TFT as a part of the control unit.

FIG. 1 is a schematic plan view of such a sensor array. In FIG. 1, numeral 101 indicates a PIN type photosensor; 102 a switching TFT; 103 a data line; 104 a gate line; and 105 a bias line. Each pixel is composed of a sensor portion and a switching TFT portion, wherein each photosensor is connected to each switching TFT which is connected to the data line 103.

FIG. 2 is a schematic cross-sectional view of one of the pixels shown in FIG. 1. In FIG. 2, numeral 101 indicates a PIN type photosensor; 102 a switching TFT; 201 a glass substrate; 202 a Cr gate electrode; 203 a SiN (silicon nitride) gate insulation film; 204 an i-type a-Si film; 205 a SiN channel protective film; 206 an $n^+$-type a-Si film; 207 an Al S-D electrode; 210, 211, 212 p-, i- and n-type a-Si films, respectively; 208 a Cr electrode; 209 an ITO electrode; 213 a SiN interlayer insulation film; and 214 a protective film.

In the following there will be briefly explained a radiation image pickup device as an example of the photodetector device utilizing the above-described sensor array substrate. FIG. 3 shows a schematic cross-sectional view of the structure of such a device.

As shown in FIG. 3, the radiation image pickup device is composed, for example, of a sensor array 301; a base member 308 serving to support the sensor array and to function as a shield against the radiation; an adhesive 309 for connecting the sensor array 301 and the base member 308; a fluorescent member 302 functioning as a wavelength converting member for converting the radiation into light to which the sensor array is sensitive; a processing circuit board 303 for processing electrical signals obtained from the sensor array; an IC 307 for driving the sensor array and the processing circuit; and a flexible wiring 304 for connecting the processing circuit board with the sensor array. These components are fixed by a frame 305 constituting the outer frame of the radiation image pickup device. The radiation enters from a direction indicated by an arrow 310. Such structure realizes a light and thin radiation image pickup device of a large size.

Lower cost, higher performance and larger area are currently being demanded for such photodetector devices but such demands have not been met because of various problems which are yet to be solved. These problems will be explained in the following.

Firstly, for realizing a larger area, particularly a size in excess of 400×400 mm, there are required a capital investment on the large-sized manufacturing facility for matching the large substrate size and automation of each equipment constituting such facility and the substrate transportation therein. This leads to an increase in the product cost.

Secondly, in case of producing a large array substrate such as the two-dimensional sensor, the increase of the substrate size results in the decrease of a manufacturing yield, leading to the increase of the product cost.

Thirdly, the increase of the area deteriorate the uniformity of device properties, and the uneven distribution of the properties within the panel (substrate) deteriorates the product quality.

Though these problems are associated with the increase of size, there is desired a large-sized semiconductor device or photodetector device of a lower cost and a higher performance.

SUMMARY OF THE INVENTION

An object of the present invention is to realize a large-sized photodetector device of a low cost and a high performance, which does not strongly necessitate a manufacturing facility for matching a large substrate size and which does not result in an increase of cost and is not associated with loss in manufacturing yield or in the uniformity of performance resulting from the increase of the substrate area.

An object of the present invention is to provide a method of producing a semiconductor device comprising a large-sized panel on which a plurality of semiconductor WF substrates are adjacently arranged in a planar manner, at least one of the sides of a semiconductor substrate is formed by cutting, which method comprises the steps: forming a plurality of semiconductor substrates by cutting so that an opposite side of each of the semiconductor substrates to be adjacently arranged is formed by substantially vertical full-cutting to remove an unnecessary portion and so that an end surface of the semiconductor substrate other than the opposite side has a groove merely formed by half-cutting between the semiconductor substrate and the unnecessary portion to leave an unnecessary portion; handling the semiconductor substrate by holding the left unnecessary portion; removing the unnecessary portion by snapping off the unnecessary portion; and arranging the semiconductor substrates so as to be adjacent to one another while the full-cutting sides thereof are mutually opposed.

Another object of the present invention is to provide a method of producing a photosensor device comprising a plurality of sensor array substrates, each having a plurality of pixels each composed of a photoelectric converting element and a switch, and a base member for supporting the plurality of sensor array substrates so as to be adjacently arranged, which, the method comprises the steps of: forming the sensor array substrate by cutting so that an opposite side of the sensor array substrate to be adjacently arranged is formed by substantially vertical full-cutting to remove an unnecessary portion and so that an end surface of sensor array substrate other than the opposite side has a groove merely formed by half-cutting between the sensor array substrate and the unnecessary portion to leave the unnecessary portion; handling the sensor array substrate by holding the left unnecessary portion; removing the left unnecessary portion by snapping off such unnecessary portion; and arranging the sensor array substrates so as to be adjacent to one another while the full-cutting sides thereof are mutually opposed.

Still another object of the present invention is to provide a method of producing a semiconductor device comprising a plurality of substrates each having a plurality of semiconductor elements, at least one of the sides of each of the substrates being mutually arranged so as to be adjacent to one another, which method comprises the steps of: forming a plurality of substrates by carrying out full-cutting of at least one side of each of the substrates having a plurality of semiconductor elements; and arranging the substrates so as to be adjacent to one another while the full-cutting sides are mutually opposed.

A further object of the present invention is to provide a semiconductor device comprising a plurality of substrates each having a plurality of semiconductor elements, at least one of the sides of each of the substrates being arranged so as to be adjacent to one another, wherein an end surface of each of the substrates on at least a side where the substrates are mutually opposite to one another has a substantially flat shape and at least one end surface of each of the substrates on at least a side where the substrates are opposite to one another has an uneven shape.

In the present invention, in the formation of a semiconductor substrate (including a form such as an insulating substrate having a thin semiconductor layer on the whole or a part of a surface thereof) or a sensor substrate by cutting and the adjacent arrangement of the semiconductor substrates or sensor substrates mutually opposed, the opposite side of each of the substrates is cut by full-cutting perpendicularly or substantially perpendicularly to the surface of the substrate, thereby enabling close arrangement. For the handling of the substrates, at least one of the sides thereof other than the opposite side in the adjacent arrangement is cut by half-cutting to form a grooved portion.

According to the present invention, the gap between the substrates can be minimized, and the final size of the substrates can be made smaller than the size in handling by removing an unnecessary portion at the grooved portion formed by half-cutting.

According to the present invention, a large area device with a low cost and a high quality can be achieved by adhering a plurality of semiconductor substrates or sensor array substrates onto a base member.

A semiconductor device or a photodetector device of a large area with high performance and a low cost can be realized by forming the semiconductor substrate or the sensor array substrate in a predetermined size by cutting in such a manner that an opposite side of the semiconductor substrate or sensor array substrate to be adjacently arranged is cut by substantially vertical full-cutting to remove an unnecessary portion and that an end surface other than the opposite side is cut by half-cutting to form a groove between the substrate and an unnecessary portion, then by removing the unnecessary portion by snapping it off at the groove and then by adhering the substrates to the base member.

Thus, the present invention can easily provide a semiconductor device in which a large-sized panel is formed by shaping a plurality of semiconductor substrates by cutting and adhering the plurality of cut semiconductor substrates in a planar manner.

Also the present invention enables handling of the semiconductor substrate by holding an unnecessary portion which is left by half-cutting on the cut semiconductor substrate. Therefore the handling of the substrate can be easily achieved without damaging the elements thereon, for example, by electrostatic charge. Also there can be obtained other advantages such as ease of cleaning after slicing.

Also, since the unnecessary portion is connected to the substrate by half-cutting, the unnecessary portion can be easily removing by snapping it off.

In consideration of a certain strength required in the half-cutting portion and the ease of snapping thereof, the remaining thickness R of the half-cutting portion is confirmed to be in a range of 0.2 mm to 0.3 mm. The full-cutting means a cutting of the whole thickness as shown in FIG. 5A. The half-cutting means a cutting of a part of the thickness as shown in FIG. 5B.

Also according to the present invention, the full-cutting portions are used as the portion for adjacently arranging the substrates, whereby the gap between the semiconductor substrates or the sensor array substrates can be minimized. Also, since the half-cutting portion is provided at the external periphery of the adhered panel, it can be formed in an area not interfering with the image or with the external dimension of the panel.

Furthermore, by producing a plurality of sensor arrays within a large-sized substrate and dividing it, it is possible to reduce the likelihood of defects such as an open circuit or a short circuit within each divided panel, whereby the overall yield after adhering the substrate can be improved.

DETAILED DESCRIPTION OF THE PREFERRED EMBODIMENTS

The present invention will be described in detail referring to preferred examples.

EXAMPLE 1

In Example 1, a large-sized photodetector device having a photoelectric converting region (light-receiving region) formed by jointing four sensor array substrates and having a size in excess of 400 mm×400 mm was produced by the following procedures.

The sensor array substrate was prepared by forming on a glass substrate, PIN type photosensors, switching TFT's, data lines, gate lines, and bias lines. The photosensors were connected to the switching TFT's which were connected to data lines.

In the following there will be explained the cutting method for the sensor array substrate and the mounting method therefor. In the present example, there will be explained an example of the method of producing a photodetector device after the preparation of a sensor array of 215 mm×215 mm on a glass substrate of 300 mm×250 mm.

Figure 1:
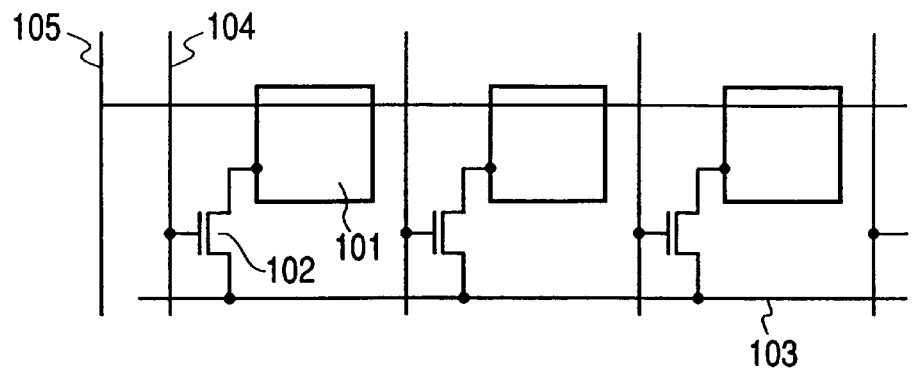
FIG. 1 is a schematic plan view for showing a part of a photosensor array.
Figure 2:
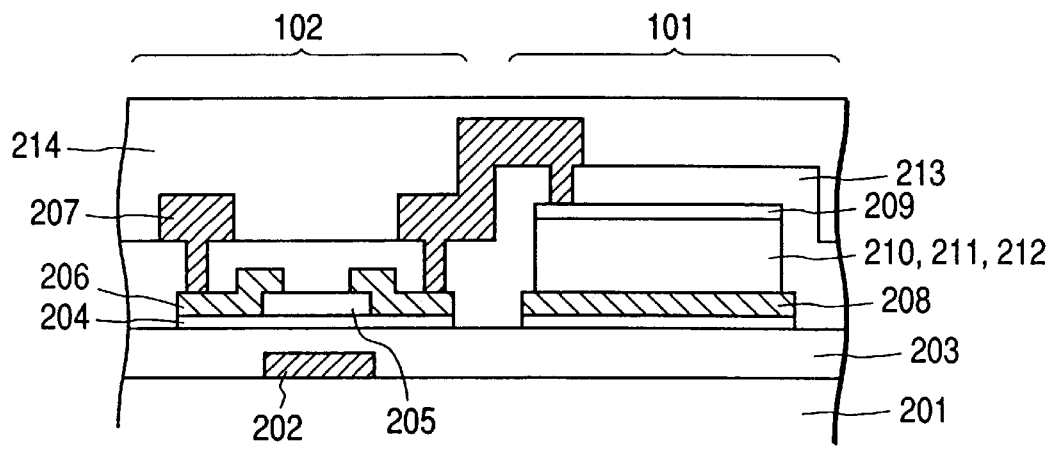
FIG. 2 is a schematic cross-sectional view for showing one pixel of the photosensor array shown in FIG. 1.
Figure 3:
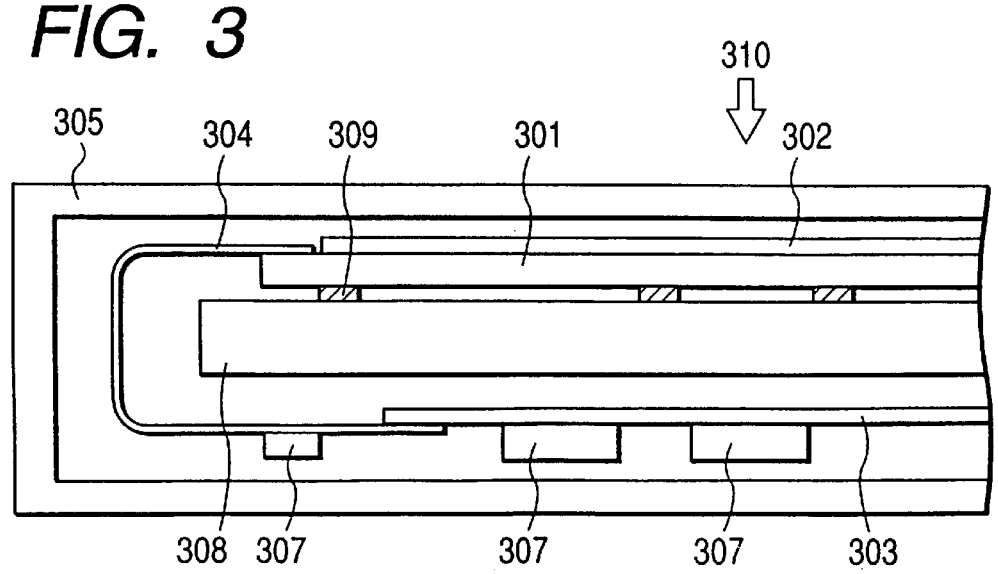
FIG. 3 is a schematic cross-sectional view for showing a radiation detecting device employing the photosensor array shown in FIGS. 1 and 2.
Figure 4:
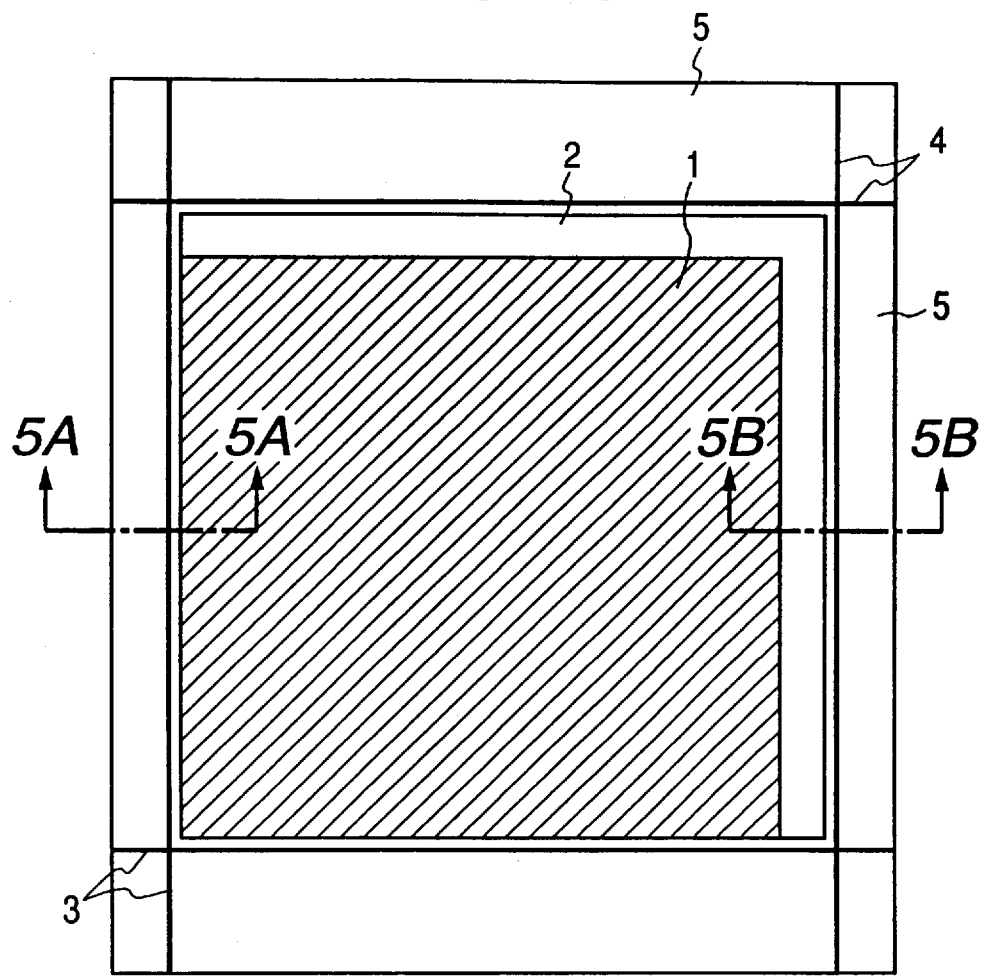
FIG. 4 is a schematic plan view for showing an example of the sensor array substrate prior to cutting.

FIG. 4 is a schematic plan view of the sensor array substrate prior to cutting the peripheral region. In FIG. 4, numeral 1 indicates a pixel region, 2 a lead wire region, 3 slicing lines of full-cutting, 4 slicing lines of half-cutting and 5 unnecessary portions.

At first, the desired parts of the sensor array substrate were cut or ground using a slicer (manufactured by K & S Co.) provided with a diamond blade (manufactured by Noritake Co.).

The cutting was carried out along the full-cutting slicing lines 3 so as to obtain a substantially vertical full-cutting. Then the grinding was carried out along the half-cutting slicing lines 4 to form grooves.

Figure 5A:
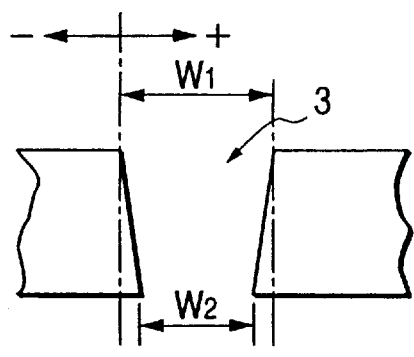
FIGS. 5A and 12A are schematic cross-sectional views for showing examples of full-cutting.
Figure 5B:
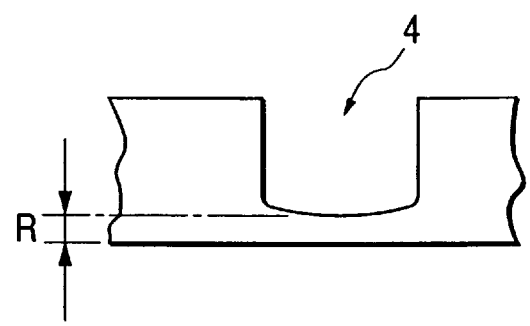
FIGS. 5B and 12B are schematic cross-sectional views for showing examples of half-cutting.

FIG. 5A is a schematic cross-sectional view of the full-cutting portion taken along the line 5A—5A of FIG. 4, while FIG. 5B is a schematic cross-sectional view of the half-cutting portion taken along the line 5B—5B of FIG. 4. In the full-cutting portion, the tapering width between the upper cutting width $W_1$ and the lower cutting width $W_2$, namely the difference $(W_2-W_1)$ thereof, is 1.5 μm in average, with a standard deviation of 3.5 μm, wherein a positive tapering is defined as positive (+) and an inverse tapering is defined as negative (−). Also in the half-cutting portion, the remaining thickness R of the groove was selected as 0.2 mm.

Figure 6:
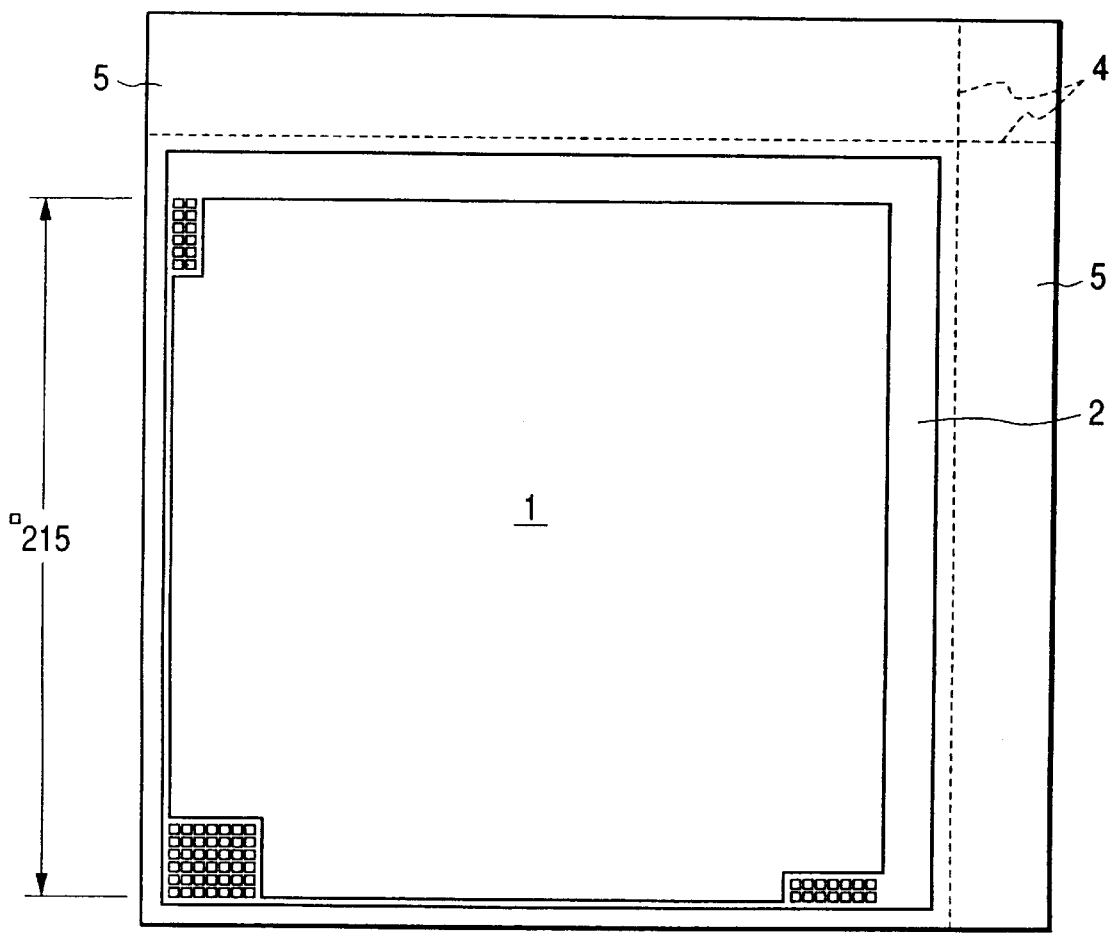
FIG. 6 is a schematic plan view for showing an example of the sensor array substrate after cutting.

FIG. 6 is a schematic plan view of the sensor array substrate after the full cutting, and it will be understood that the substrate can be handled by the unnecessary portions 5. Consequently the cleaning after slicing can be facilitated.

Thereafter the unnecessary portions 5 were removed by snapping them off. In consideration of certain necessary strength and ease of snapping, the preferred remaining thickness R of the half-cutting portion is mostly in a range of 0.2 mm to 0.3 mm, though it is somewhat variable depending on the material used or the dimension of the substrate.

Figure 7:
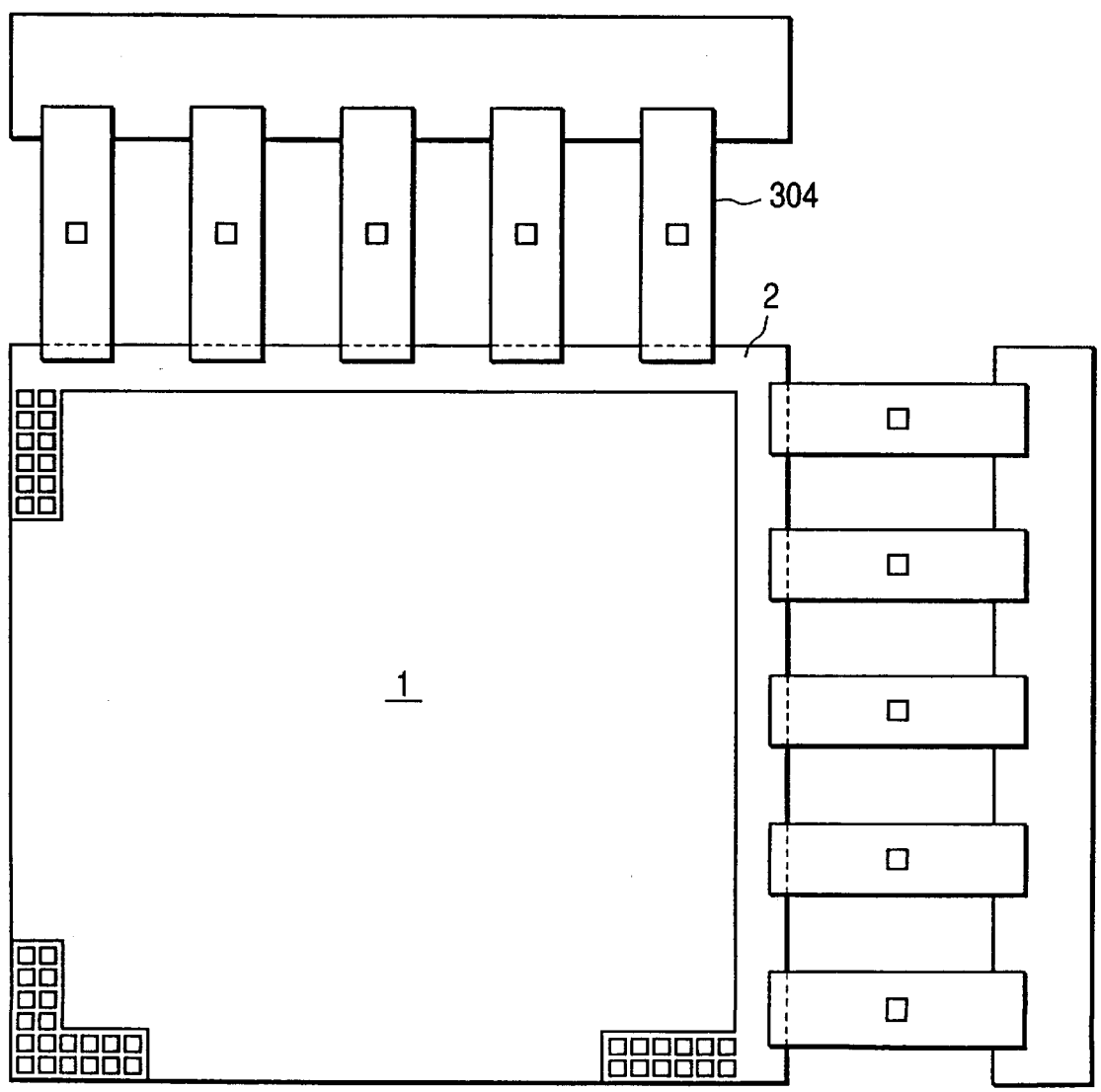
FIG. 7 is a schematic plan view for showing an example of mounting of the sensor array substrate.

Subsequently, as shown in FIG. 7, an anisotropically conductive film (not shown in the drawings) was temporarily connected to the sensor array substrate, and flexible wirings 304 were pressed thereon and fixed with silicone resin. Then the flexible wirings 304 were soldered to the processing circuit substrate.

Figure 8A:
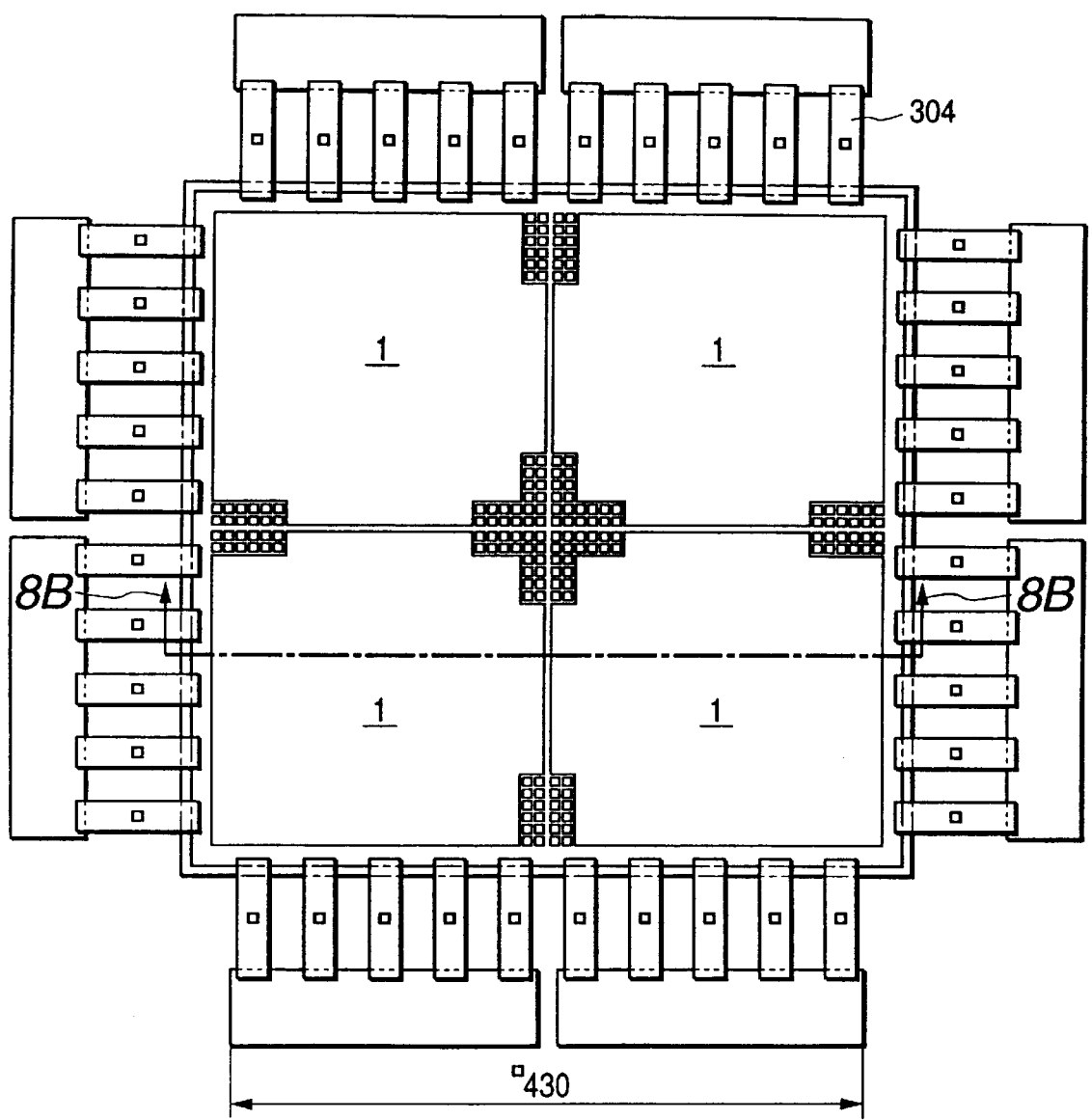
FIG. 8A is a schematic plan view for showing a close arrangement of a plurality of sensor array substrates.
Figure 8B:
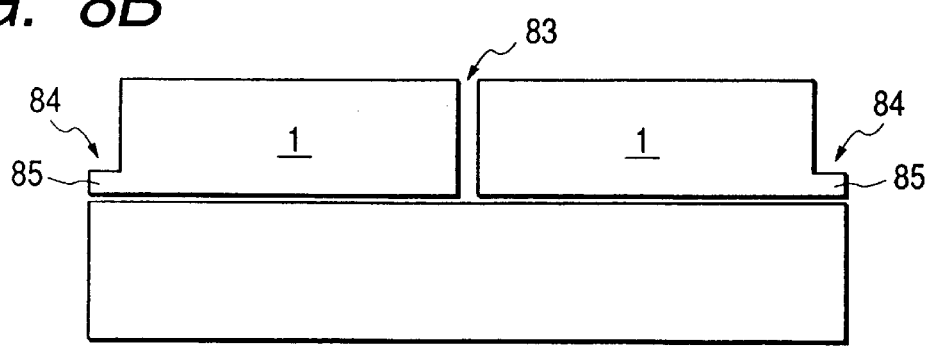
FIG. 8B is a schematic cross-sectional view taken along the line 8B—8B in FIG. 8A.

Thereafter a plurality of sensor array substrates were adhered to the base member, as shown in a schematic plan view of FIG. 8A. Also FIG. 8B is a schematic cross-sectional view taken along the line 8B—8B of FIG. 8A. As shown in FIG. 8B, a full-cutting portion 83 constituted the jointing portion of the substrates, so that the gap between the sensor arrays could be minimized. On the other hand, the half-cutting portion 84 having a protrusion 85 was positioned in the peripheral part of a panel for adhering the substrate and was formed in a range not interfering with the image or the external dimension.

The photosensor device thus prepared by adhering the plurality of sensor array substrates adjacently arranged could be produced by the conventional facility even in the ease of having an area exceeding the area of one substrate producible in the conventional facility, and the production yield was significantly improved in comparison with the case the device was produced with a single substrate, for example a substrate of a size exceeding 400 mm×400 mm. In other words, the division of the sensor array substrate into four decreased the defect percentage in each single substrate, whereby there could be obtained an inexpensive photosensor device (which is a semiconductor device).

EXAMPLE 2

In this example, an inexpensive sensor array of which manufacturing process is simplified by using a same film structure of the photoelectric converting elements and the switching TFT's was used, and a radiation image pickup device utilizing a photosensor device was formed by adhering four sensor array substrates in the same manner as in Example 1.

Figure 9:
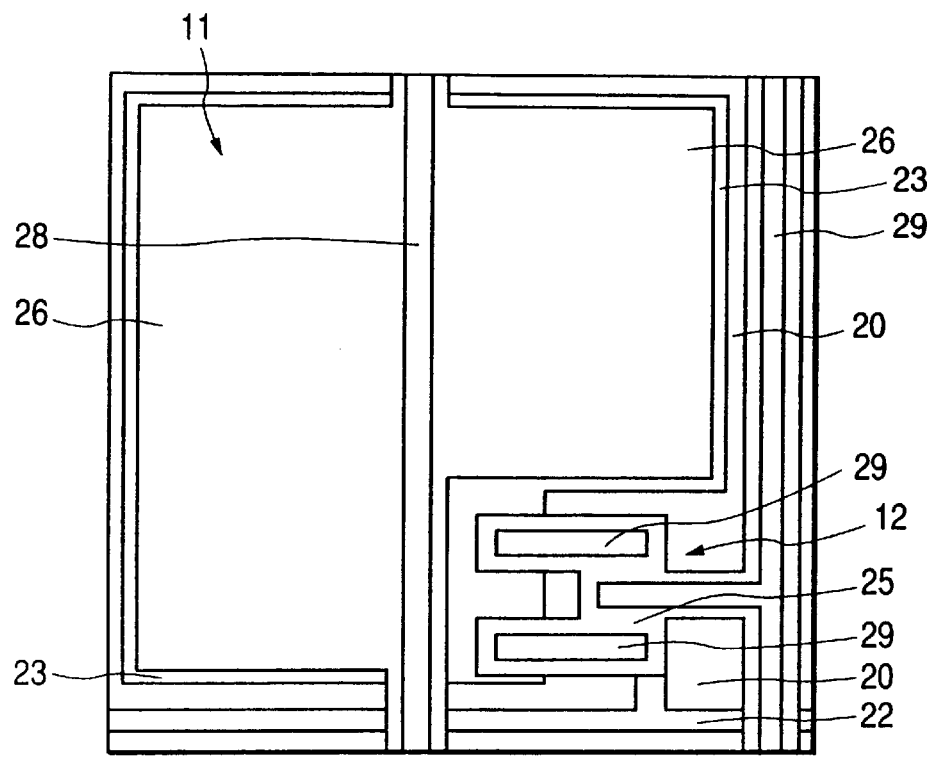
FIG. 9 is a schematic plan view for showing an example of a pixel of the photosensor array.
Figure 10:
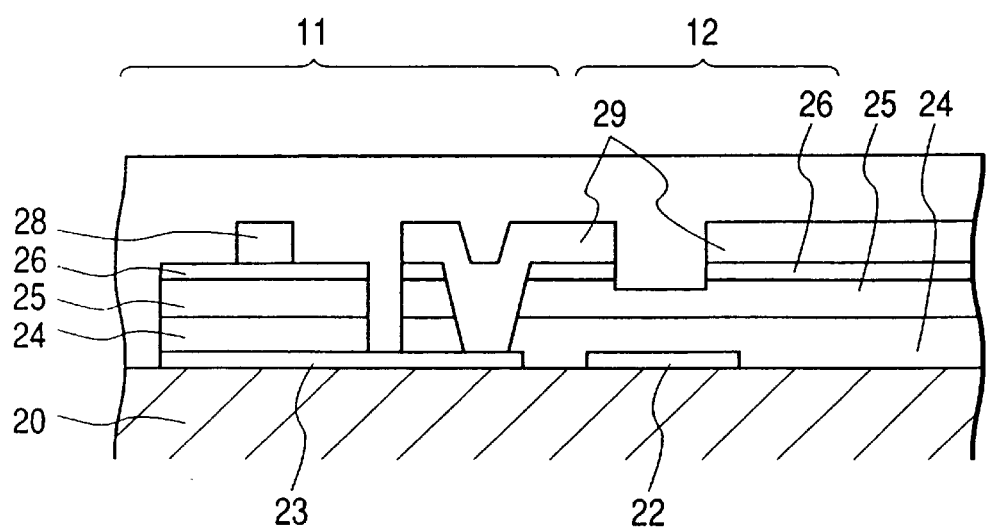
FIG. 10 is a schematic cross-sectional view of a pixel shown in FIG. 9.

FIG. 9 is a schematic plan view of one pixel of the present example. In FIG. 9, numeral 11 indicates a MIS photoelectric converting element portion and 12 a switching TFT portion, and FIG. 10 is a schematic cross-sectional view of the pixel shown in FIG. 9. On a glass substrate 20, the pixel was composed of an MIS photoelectric converting element 11 having a first electrode layer 23, an insulating layer 24, a photoelectric converting semiconductor layer 25, a layer 26 for preventing the injection of carriers into the semiconductor layer, and a second electrode layer 28; and a switching TFT 12 having a first electrode layer 22, an insulating layer 24, a semiconductor layer 25, an ohmic contact layer 26 to the semiconductor layer, and a second electrode layer 29, both being producible by the same and simplified process.

In the following there will be explained the cutting method for the sensor array substrate and the mounting method therefor. Also in the present example, there will be explained the method of producing a radiation image pickup after the preparation of four sensor arrays of 100 mm×100 mm on a glass substrate of 300 mm×250 mm.

Figure 11:
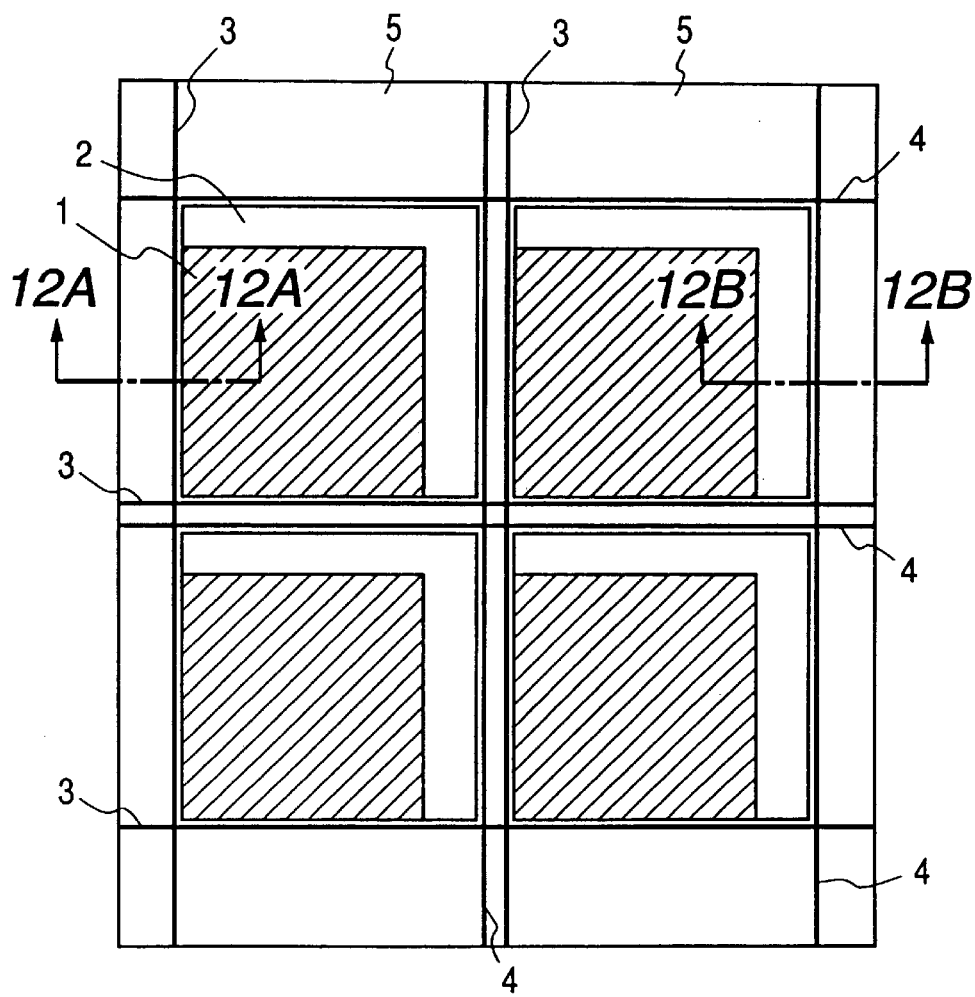
FIG. 11 is a schematic plan view for showing an example of the sensor array substrate prior to cutting.

At first, the sensor array substrate was cut or processed to form a groove formation by using an excimer laser (KrF). FIG. 11 is a schematic plan view of the sensor array substrate. In FIG. 11, numeral 1 indicates a pixel region, 2 a lead wiring portion, 3 full-cutting slicing lines, 4 half-cutting slicing lines and 5 unnecessary portions.

At first the sensor array substrate was cut along the full-cutting slicing lines 3 in such a manner that the cutting surface was substantially perpendicular to the surface of the sensor array substrate. Then grooves were formed along the half-cutting slicing lines 4 by cutting.

Figure 12A:
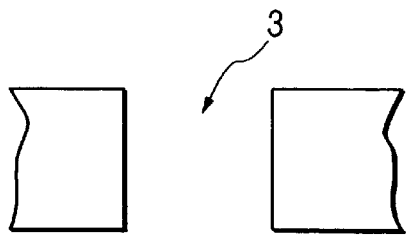
Figure 12B:
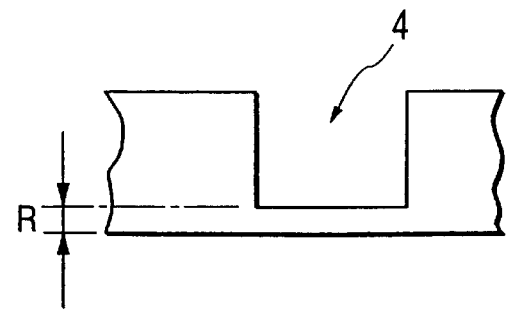

FIGS. 12A and 12B are schematic cross-sectional views showing a full-cutting portion taken along the line 12A—12A of FIG. 11 and a half-cutting portion taken along the line 12B—12B of FIG. 11, respectively. The remaining thickness R of the groove at the half-cutting portion was selected as 0.2 mm.

Then the substrate was cleaned by holding the left unnecessary portion 5 in the same manner as in Example 1.

Thereafter, the left unnecessary portion 5 was snapped along the half-cutting slicing lines 4 to remove the unnecessary portions 5.

Subsequently, an anisotropically conductive film was temporarily connected to the sensor array substrate, and flexible wirings were pressed thereon and fixed with silicone resin. Then the flexible wirings were soldered to the processing circuit substrate.

Thereafter the plurality of sensor array substrates were adhered to the base member in the same manner as in Example 1, and a fluorescent member was adhered with epoxy resin at a side where the radiation enters.

Figure 13:
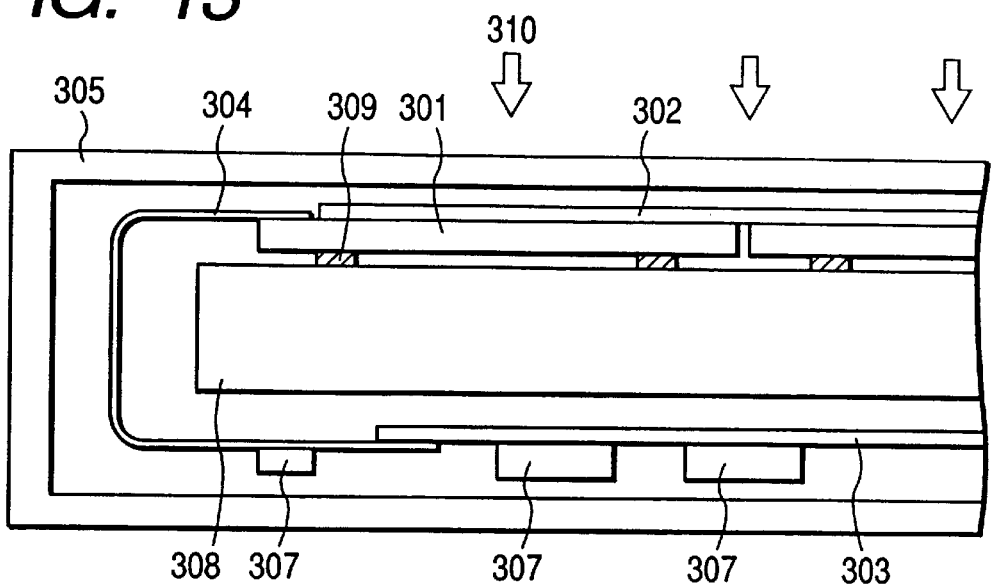
FIG. 13 is a schematic cross-sectional view showing an example of the radiation detecting device.

Finally, the adhered sensor array substrates were mounted on the frame of the radiation image pickup device. FIG. 13 is a schematic cross-sectional view thereof. In FIG. 13, a plurality of sensor array substrates 301 were fixed to the base member 308 with the adhesive 309 in a simple manner. The radiation image pickup device was composed of a fluorescent member 302 for converting the radiation into light to which the sensor arrays were sensitive, a processing circuit board 303 for processing electrical signals obtained from the sensor arrays, IC's 307 provided on the processing circuit board and flexible wirings 304 for connecting the processing circuit board with the sensor arrays. These components were fixed by a frame 305 constituting the outer casing of the radiation image pickup device. The radiation enters from a direction indicated by an arrow 310. Such structure realizes a thin and light-weight radiation image pickup device.

Figure 14:
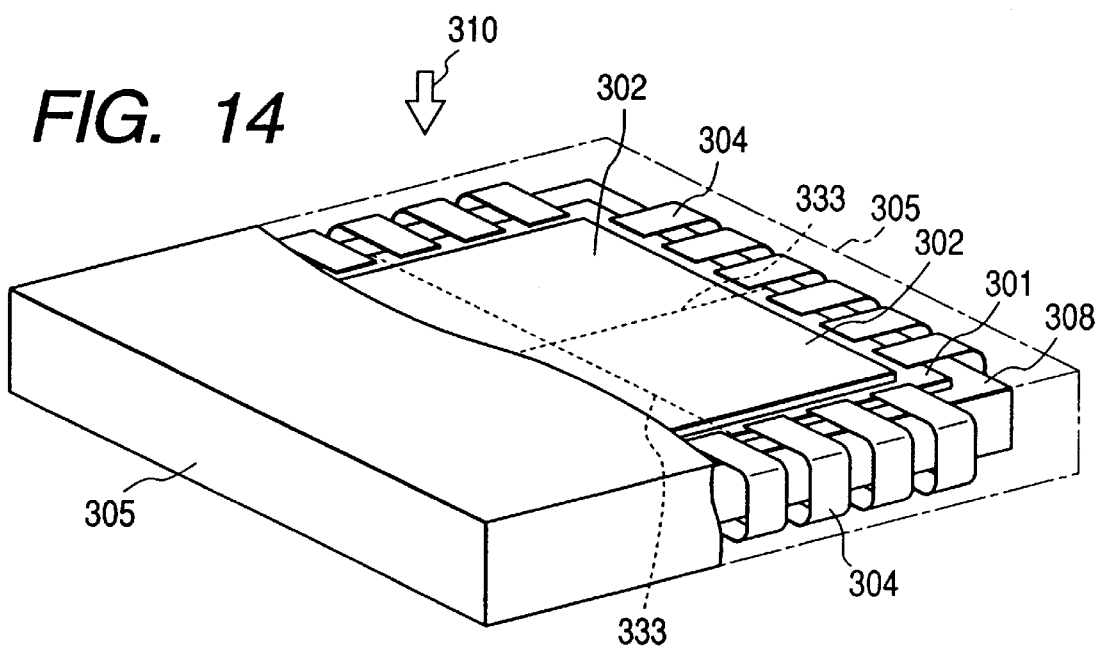
FIG. 14 is a schematic perspective view of the device shown in FIG. 13.

FIG. 14 is a schematic perspective view of such device, in which a part of the frame 305 is omitted for the purpose of clarity, and broken lines indicate the junctions of the sensor array substrates. As explained in the foregoing, the method of producing the device by preparing a plurality of sensor arrays within the same glass substrate, then dividing the substrate and adhering the divided substrates to thereby improve the overall yield and achieve a lower cost in comparison with the method of producing the device by preparing at a time the entire substrate having the same size as the base member without dividing the substrate.

Figure 15:
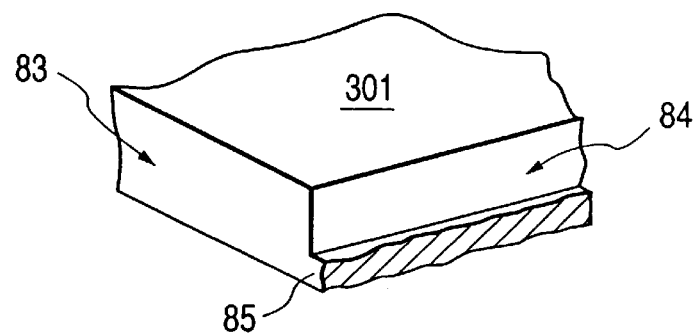
FIG. 15 is a schematic perspective view for showing an example of the end surface of the substrate after removal of the unnecessary portion along the half-cutting portion.

FIG. 15 shows an example of the end surface of the substrate after the removal of the unnecessary portion along the half-cutting portion. As shown in FIG. 15, the obtained end surface from the top portion to a middle portion in the thickness of the substrate was flat owing to the half-cutting, and the uncut portion was a protruding portion remaining along the elongated direction of the substrate. The end surface of such protruding portion is generally uneven as shown in FIG. 15 when the unnecessary portion is removed by snapping it off.

As explained in the foregoing, the present invention facilitates handling of the substrate, thereby reducing the damage to the panel due to electrostatic charge or the like because the substrate can be handled by holding the unnecessary portion which is left connected by the half-cutting portion.

Also the unnecessary portion left by half-cutting can be easily removed by snapping along the half-cutting portion.

Also in cutting the substrate having the sensor array composed of the photoelectric converting elements and the switching elements, the full-cutting and the half-cutting are suitably combined so that the full-cutting portions constitute the Junction portions of the plurality of sensor array substrates when adhered on the base member, whereby the gap between the sensor arrays can be minimized. Since the half-cutting portions are positioned in the external periphery portion of the adhered panels, the half-cutting portions can be formed in a region not interfering with the image or the external dimension of the panel, thereby realizing a device of a larger size and a lower cost resulting from the improved yield of the panel.

Also the method of preparing a plurality of sensor arrays within the same substrate and then dividing the substrate to reduce the percentage of defects such as open circuit or short circuit within a panel thereby increases the overall yield.

The present invention is evidently applicable to all the semiconductor devices comprising a large-sized substrate formed by adhering and can provide similar advantages in all such devices.

In the present invention, the removal of the unnecessary portion by the half-cutting portion need not be carried out immediately after the cleaning but can naturally be carried out at any suitable timing. Also the half-cutting line may be used for other purposes such as region division, and the removal of a part of the substrate by the half-cutting line need not be necessarily carried out.

The present invention is not limited to the foregoing examples but encompasses any and all modifications or combinations within the spirit and scope of the present invention.

What is claimed is:

1. A method of producing a semiconductor device comprising a plurality of semiconductor substrates which are arranged adjacent to one another in a planar manner, at least one of the peripheral sides of each of the semiconductor substrates being formed by cutting, which comprises the steps of:

forming the semiconductor substrates by cutting so that an opposite side of the semiconductor substrate to be adjacently arranged is formed by substantially vertical full-cutting to remove an unnecessary portion, and so that an end surface of the semiconductor substrate other than the opposite side has a groove merely formed by half-cutting between the semiconductor substrate and an unnecessary portion to leave the unnecessary portion;

handling the semiconductor substrate by holding the left unnecessary portion;

removing the left unnecessary portion by snapping off; and arranging the semiconductor substrates so as to be adjacent to one another while the full-cutting sides thereof are mutually opposed.

2. A method of producing a photodetector device comprising a plurality of sensor array substrates which each having a plurality of pixels each composed of a photoelectric converting element and a switch, and a base member for supporting the plurality of sensor array substrates so as to be adjacently arranged, which comprises the steps of:

forming the sensor array substrate by cutting so that an opposite side of each of the sensor array substrates to be adjacently arranged is formed by substantially vertical full-cutting to remove an unnecessary portion, and so that an end surface of the sensor array substrate other than the opposite side has a groove merely formed by half-cutting between the sensor array substrate and the unnecessary portion to leave the unnecessary portion;

handling the substrate by holding the left unnecessary portion;

removing the left unnecessary portion by snapping off; and arranging the sensor array substrates so as to be adjacent to one another while the full-cutting sides thereof are mutually opposed.

3. A method of producing a photodetector device according to claim 2, wherein the photodetector device comprises four sensor array substrates which are mutually arranged so as to be adjacent to one another.

4. A method for producing a photodetector device according to claim 2, wherein the remaining thickness of the substrate in the half-cutting groove is within a range of 0.2 mm to 0.3 mm.

5. A method of producing a photodetector device according to claim 2, further comprising a step of providing a fluorescent plate on the sensor array substrates.

6. A method of producing a semiconductor device comprising a plurality of substrates each having a plurality of semiconductor elements, at least one of sides of each of the substrates being mutually arranged so as to be adjacent to one another, which comprises the steps of:

forming a plurality of substrates by carrying out full-cutting of at least one side of each of the substrate having a plurality of semiconductor elements and by carrying out half-cutting of at least one side different from the full-cutting side; and arranging the substrates so as to be adjacent to one another while the full-cutting sides are mutually opposed.

7. A method of producing a semiconductor device according to claim 6, further comprising a step of removing a part of the substrate along the portion of the half-cutting.

8. A method of producing a semiconductor device according to claim 6, wherein a handling portion for the substrate is provided along the portion of the half-cutting.

9. A method of producing a semiconductor device according to claim 6, wherein the semiconductor element comprises a thin film transistor.

10. A method of producing a semiconductor device according to claim 6, wherein the semiconductor element comprises a photoelectric converting element.

11. A method of producing a semiconductor device according to claim 6, wherein the semiconductor elements are arranged in a matrix shape.

12. A method of producing a semiconductor device according to claim 6, wherein the semiconductor elements are arranged in a matrix shape, and at least the full-cutting is formed along to rows or columns constituting the matrix shape.

13. A method of producing a semiconductor device according to claim 10, further comprising a step of providing a wavelength converting member on each of the semiconductor elements.

14. A method of producing a semiconductor device according to claim 13, wherein the wavelength converting member comprises a fluorescent member.

15. A method of producing a semiconductor device according to claim 6, wherein the semiconductor element comprises a pair of a thin film transistor and a photoelectric converting element.

16. A method of producing a semiconductor device comprising a semiconductor substrate, at least one of the peripheral sides of the semiconductor substrate being formed by cutting, which comprises the steps of:

(a) full-cutting to form one of the peripheral sides of the semiconductor substrate; and (b) forming a cut in at least a portion corresponding to another side of the semiconductor substrate without full-cutting.

17. A method of producing a semiconductor device according to claim 16, further comprising a step of handling the semiconductor substrate by a remaining portion not cut in step (b).

18. A method of producing a semiconductor device according to claim 16, further comprising a step of removing an unnecessary portion of the semiconductor substrate using the cut formed in step (b).

19. A method of producing a semiconductor device according to claim 17, further comprising a step of removing an unnecessary portion of the semiconductor substrate using the cut formed in step (b).

20. A method of producing a semiconductor device according to claim 18, wherein the semiconductor substrate is folded along the cut to remove the unnecessary portion.

21. A method of producing a semiconductor device according to claim 19, wherein the semiconductor substrate is folded along the cut to remove the unnecessary portion.

22. A method of producing a semiconductor device according to claim 16, further comprising a step of preparing a plurality of semiconductor substrates as in step (a) and arranging the semiconductor substrates so as to be adjacent to each other.

23. A method of producing a semiconductor device according to claim 17, further comprising a step of preparing a plurality of semiconductor substrates as in step (a) and arranging the semiconductor substrates so as to be adjacent to each other.

24. A method of producing a semiconductor device according to claim 18, further comprising a step of preparing a plurality of semiconductor substrates as in step (a) and arranging the semiconductor substrates so as to be adjacent to each other.

25. A method of producing a semiconductor device according to claim 19, further comprising a step of preparing a plurality of semiconductor substrates as in step (a) and arranging the semiconductor substrates so as to be adjacent to each other.

26. A method of producing a semiconductor device according to claim 20, further comprising a step of preparing a plurality of semiconductor substrates as in step (a) and arranging the semiconductor substrates so as to be adjacent to each other.

27. A method of producing a semiconductor device according to claim 21, further comprising a step of preparing a plurality of semiconductor substrates as in step (a) and arranging the semiconductor substrates so as to be adjacent to each other.

28. A method of producing a semiconductor device according to any one of claims 16 to 27, wherein the semiconductor substrate is a sensor.

29. A method of producing a semiconductor device according to any one of claims 16 to 27, wherein the semiconductor substrate is a switching element.

30. A method of producing a semiconductor device according to claim 28, wherein the sensor is a photoelectric conversion sensor.

31. A method of producing a semiconductor device according to claim 28, wherein the sensor is a photoelectric conversion sensor, and further comprising a step of providing a wavelength converting member on the sensor.

32. A method of producing a semiconductor device according to claim 31, wherein the wavelength converting member is a fluorescent member.

33. A method of producing a semiconductor device according to any one of claims 16 to 27, wherein the semiconductor substrate has a plurality of photoelectric conversion elements and the photoelectric conversion elements are arranged along the side cut in step (a).

34. A method of producing a semiconductor device according to any one of claims 16 to 27, wherein the semiconductor substrate comprises a light-transmissive substrate having a semiconductor layer thereon.

35. A method of producing a semiconductor device according to claim 16, wherein the semiconductor substrate is not fully cut in step (b) such that it has a thickness of 0.2 mm to 0.3 mm at a cut portion thereof.

36. A method of producing a semiconductor device according to claim 16, wherein the semiconductor device is a photodetector device.

* * * * *

UNITED STATES PATENT AND TRADEMARK OFFICE
CERTIFICATE OF CORRECTION

PATENT NO.    : 6,300,159 B1
DATED         : October 9, 2001
INVENTOR(S)   : Chiori Mochizuki Page 1 of 1

It is certified that error appears in the above-identified patent and that said Letters Patent is hereby corrected as shown below:

Column 2,
Line 28, "deteriorate" should read -- deteriorates --; and
Line 48, "WF" should be deleted.

Column 4,
Line 21, "removing" should read -- removed --.

Column 8,
Line 15, "Junction" should read -- junction --.

Column 9,
Line 35, "one of" should read -- one of the --;
Line 39, "substrate" should read -- substrates --; and
Line 64, "to" should read -- two --.

Column 10,
Line 7, "transistor" should read -- transistors --.

Signed and Sealed this

Twelfth Day of March, 2002

Attest:

*Attesting Officer*

JAMES E. ROGAN
*Director of the United States Patent and Trademark Office*